(12) United States Patent
Holland et al.

(10) Patent No.: US 9,196,497 B2
(45) Date of Patent: Nov. 24, 2015

(54) PHOTOLYTIC PROCESSING OF MATERIALS WITH HYDROGEN

(75) Inventors: Orin W. Holland, Mt. Juliet, TN (US);
Ryan J. Cottier, Ardmore, OK (US);
Terry D. Golding, Ardmore, OK (US);
Khalid Hossain, Ardmore, OK (US);
Ronald Paul Hellmer, Round Rock, TX (US)

(73) Assignee: Amethyst Research, Inc., Ardmore, OK (US)

(*) Notice: Subject to any disclaimer, the term of this patent is extended or adjusted under 35 U.S.C. 154(b) by 1143 days.

(21) Appl. No.: 13/155,947

(22) Filed: Jun. 8, 2011

(65) Prior Publication Data

US 2011/0297534 A1 Dec. 8, 2011

Related U.S. Application Data

(60) Provisional application No. 61/352,518, filed on Jun. 8, 2010, provisional application No. 61/363,909, filed on Jul. 13, 2010.

(51) Int. Cl.
*H01L 21/02* (2006.01)
*H01L 21/30* (2006.01)
*H01L 21/302* (2006.01)

(52) U.S. Cl.
CPC ...... *H01L 21/3003* (2013.01); *H01L 21/02041* (2013.01); *H01L 21/02043* (2013.01); *H01L 21/02046* (2013.01); *H01L 21/02057* (2013.01); *H01L 21/302* (2013.01)

(58) Field of Classification Search
CPC ............ H01L 21/02041; H01L 21/02043; H01L 21/02057
See application file for complete search history.

(56) References Cited

U.S. PATENT DOCUMENTS

| | | | | | |
|---|---|---|---|---|---|
| 5,068,040 | A | * | 11/1991 | Jackson | 134/1 |
| 5,194,398 | A | * | 3/1993 | Miyachi et al. | 257/E21.212 |
| 5,464,664 | A | * | 11/1995 | Aydil | C23C 8/36 257/E21.213 |
| 5,494,643 | A | * | 2/1996 | Kennedy, III | 422/186.3 |
| 6,159,421 | A | * | 12/2000 | Fujii | 134/1.3 |
| 6,632,711 | B2 | * | 10/2003 | Sugano et al. | 438/795 |

* cited by examiner

*Primary Examiner* — Evan Pert
(74) *Attorney, Agent, or Firm* — Tomlinson Rust McKinstry Grable

(57) ABSTRACT

An apparatus and method for hydrogenating a sample, such as a semiconductor wafer. The invention utilizes a top electrode comprising a UV-transparent dielectric and a metal contact to provide an electric field to the sample while the sample is irradiated with UV light and hydrogenated with a hydrogenating gas or gasses. The field may be applied to the sample at a number of different pressures, temperatures and concentrations of gas to manipulate the rate and type of hydrogenation. Further, the method of hydrogenating the sample may be used in conjunction with masking and etching techniques.

30 Claims, 5 Drawing Sheets

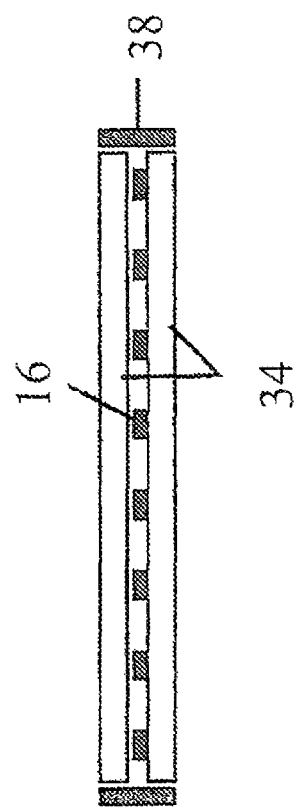

PHOTOLYTIC PROCESSING OF MATERIALS WITH HYDROGEN

CROSS REFERENCE TO RELATED APPLICATIONS

This application is claims the benefit of U.S. Provisional Patent Application No. 61/352,518 filed Jun. 8, 2010 and U.S. Provisional Patent Application No. 61/363,909 filed Jul. 13, 2010, the contents of which are incorporated herein by reference.

FIELD OF THE INVENTION

The invention is related to methods and apparatus for hydrogen processing of semiconductors.

SUMMARY OF THE INVENTION

The invention is directed to a UV-transparent electrode assembly for hydrogenation of a sample. The electrode assembly comprises a sample location, a source of UV light, and a top electrode. The sample location is adapted to receive the sample and comprises a metal base. The top electrode is disposed between the source and the sample location. The top electrode comprises a UV transparent portion and a metal contact disposed proximate the UV transparent portion. The top electrode is disposed proximate the sample such that a gap exists between the sample location and the top electrode and such that when the sample is placed at the sample location, the top electrode does not touch the sample.

In another embodiment the invention is directed to a method for hydrogenating a sample. The method comprises placing the sample at a sample location, and providing a top electrode. The top electrode comprises a UV-transparent material and a metal contact such that a gap exists between the top electrode and the sample location. The method further comprises providing hydrogen gas to the sample at the gap, irradiating the sample with UV-light, and providing an electric field to the metal contact during irradiation.

In another embodiment the invention is directed to a method for extracting hydrogen from a semiconductor wafer. The method comprises placing the sample at a sample location and providing a top electrode. The top electrode comprises a UV-transparent material and a metal contact such that a gap exists between the top electrode and the sample location. The method further comprises applying a high electric field near the sample location, irradiating the sample with UV-light, and providing a pressure of at or below atmospheric pressure to the sample.

In another embodiment the invention is directed to a method for cleaning a sample. The method comprises placing the sample at a sample location, placing the sample location proximate a UV source and a source of a cleaning gas at a pressure at or below atmospheric pressure, and providing UV light and the cleaning gas to the sample.

BRIEF DESCRIPTION OF THE DRAWINGS

FIG. 3 is an encapsulated metal contact.

BACKGROUND

Figure 1:
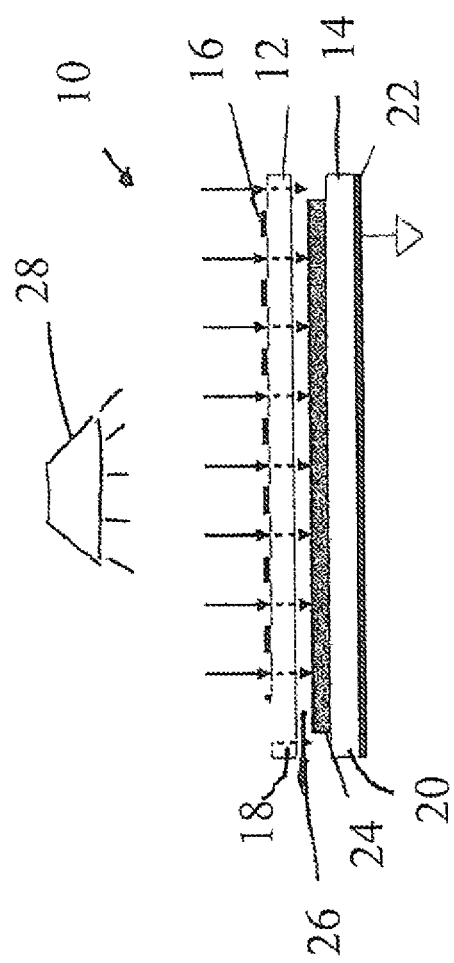
FIG. 1 is a side view of an electrode assembly for the hydrogen processing of a semiconductor.

While hydrogenation of materials is a rather straightforward process, its underlying behavior can be quite complex. In general, since the activity of molecular hydrogen is extremely low, it must be dissociated into its atomic parts to enable surface reactions (etching) and/or bulk in-diffusion (hydrogenation). Prior Art includes a number of techniques that are used to dissociate hydrogen include thermal processing techniques. These techniques include ranging from annealing in hydrogen forming gas and thermal cracking, which utilizes a hot filament to crack or dissociate molecular hydrogen. The cracking technique is most often applied for surface etching rather than hydrogenation. As such, it is normally processed at low pressure $\sim 10^{-4}$ Torr with the wafer held at a relatively high temperature to enhance its reactivity to hydrogen.

Exposure of material to hydrogen plasma has also been used to hydrogenate, as well as clean semiconductor surfaces. Plasma contains electrically charged particles in addition to neutral atoms and molecules. Energetic electrons in the plasma break up molecules and ionize the gas resulting in extremely hot plasma that is far from thermodynamic equilibrium. Substantial surface modification due to etching occurs, which generally makes this technique unsuitable for hydrogenation.

Ion implantation has also been used to hydrogenate materials. While the implanted dose is not limited by solubility limits, substantial lattice damage can occur as a result of the interaction between the energetic ions and lattice atoms. Furthermore, since energetic ions penetrate below the surface, implanted hydrogen is not available for surface modification (a benefit or a limitation depending upon the objective of the process). Therefore, there are substantial drawbacks to these processing techniques. Both cracking and plasma processes are inherently "hot" processes that are generally performed at low pressure, i.e. $10^{-4}$ to $10^{-2}$ Torr and, by design, substantially modify the surface; while ion implantation substantially damages the bulk over the ion range. Also, a highly ionized plasma, as well as ion implantation, can charge the semiconductor surface resulting in an electrostatic discharge that can destroy sensitive device structures on patterned wafers.

Alternatively, a photolytic process involving the use of ultraviolet (UV) light can be used to activate hydrogen processing of materials. It has many advantages over other prior-art technologies including greater process flexibility and control. This includes processes such as hydrogenation for electrical passivation of defects (located within the bulk or at internal interfaces of composite materials such as a heterostructure), which hereafter referred to only as "hydrogenation." The advantages of UV-activated hydrogenation are extensive including an inherently low thermal budget and process flexibility. In addition, since it does not ionize hydrogen, charging of the surface does not occur. Therefore, UV-assisted processing is a highly flexible process that can be modified by the judicious choice of UV-lamp or filters to yield a photon bandwidth that is application specific.

Atomic hydrogen is a free radical consisting of a proton and an electron and is a powerful reducing agent capable of forming bonds at the surface or within the body of a semiconductor, especially with defects. Since most semiconductors possess open lattice structures (such as diamond, zinc blende or the wurzite), atomic hydrogen rapidly diffuses interstitially or along open-volume pathways such as dislocations. As such the size of atomic hydrogen becomes an important factor in determining its mobility. However, the charge-state of atomic hydrogen is affected by the position of the Fermi level, positive-charged hydrogen ($H^+$) is often the preferred state due to its small size (compared to $H^-$ or $H^0$). In general, hydrogen is an amphoteric dopant, i.e. can either provide an electron or a hole for electric conduction. At equilibrium, it acts to counter the dominant type of doping, i.e. in n-type material it is an acceptor, and in p-type it is a donor. In addition, the solubility of hydrogen in materials is generally quite low but has only been studied extensively in silicon. Reported values range from $10^{2-5}$ cm$^{-3}$ at 500 K at typical hydrogenation temperature. Therefore, hydrogen is mostly bound in semiconductors as a result of trapping by structural defects or impurities. Such bonding with defects often results in their deactivation.

Molecular hydrogen, $H_2$, must undergo dissociation either in the gas phase or during surface adsorption to be reactive and in-diffuse into materials. Considering the large dissociation energy (4.52 eV), there is little doubt that the formation of atomic hydrogen by molecular dissociation is often the rate limiting step in any hydrogen-related process. However, it is well-known that hydrogen gas is transparent to UV, since it does not couple to UV-light due to its zero electric dipole moment, and therefore does not react with hydrogen gas. Rather, it is thought that UV-activates dissociation by changing the surface potential of materials. While the sticking coefficient of molecular adsorption on metal surfaces is relatively high, it is generally thought that the interaction of molecular hydrogen with the surface potential of semiconductors, e.g. silicon, is repulsive and inhibits hydrogen adsorption. Such changes in the surface potential occur during UV-irradiation simply as a result of surface charging by ejection of photoelectrons, i.e. electrons ejected from the surface of a material. The maximum energy of an electron ejected from a solid ($E_{max}=h\upsilon-W$) is determined by the blocking potential (V) or the work function (W=eV), where e is the electronic charge, h is Planck's constant and $\upsilon$ is the photon frequency. Therefore, photons must have an energy, $h\upsilon$, greater than W to yield photoelectrons. The work function in a semiconductor is not a constant but depends critically upon the Fermi level and temperature, as well as the state of the surface, e.g. presence of native oxides. Typically, the work function of most materials ranges from 3-7 eV, although values for insulators can be greater due to their large band gap. Thus, adsorption of hydrogen on the surface of many materials, and subsequent dissociation, can occur as a result of changes in the surface potential due to UV irradiation. While a detailed model for dissociation of molecular hydrogen does not exist, it is clear that the rate of dissociation is enhanced by UV irradiation. This enhancement clearly occurs as a result of UV-activated changes in the surface potential, as well as by direct interaction of the UV-light with the adsorbed hydrogen. (This assumes little or no surface leakage of the accumulated charge.) Therefore, the adsorption of hydrogen and its subsequent dissociation on the surface can be affected by application of an external electric field to the sample. Such field-induced changes, in addition to the field-induced drift within the sample, could then be used to affect the kinetics associated with the motion of hydrogen in- or out-diffusion.

DETAILED DESCRIPTION OF THE DRAWINGS

With reference now to the figures in general and to FIG. 1 specifically, shown therein is an electrode assembly 10. The electrode assembly comprises a top electrode 12 and a sample location 14. The top electrode 12 comprises a metal contact 16, and a top dielectric 18. The sample location 14 comprises a bottom dielectric 20 and a metal base 22. A sample 24 is placed at the sample location 14 such that a gap 26 is located between the top electrode 12 and the sample 24. The sample 24 may be a semiconductor wafer or other object to be treated by the electrode assembly 10. A UV source 28 may provide UV radiation to the sample 24 through the top electrode 12.

The surface potential of the sample 24 can be altered by application of DC or AC voltage to the metal contact 16 and metal base 22 and thus to the sample 24 to enhance or retard hydrogen-related processing. Thus, the metal contact 16 may have a voltage while the metal base 22 is grounded. Alternatively, an electrical potential may be applied to the sample 24 by applying one voltage to the metal contact 16 and a second voltage to the metal base 22. The top dielectric 18 is comprised of a UV transparent, metal-dielectric couple that permits UV irradiation to penetrate to the sample 24 surface. The gap 26 between the top electrode 12 and the surface of the sample 24 allows for infusion and penetration of the hydrogen gas into this region where it interacts with UV irradiation to dissociate the molecular gas. This gap 26 must be minimized to maintain a large electric field within the sample 24.

Figure 2B:
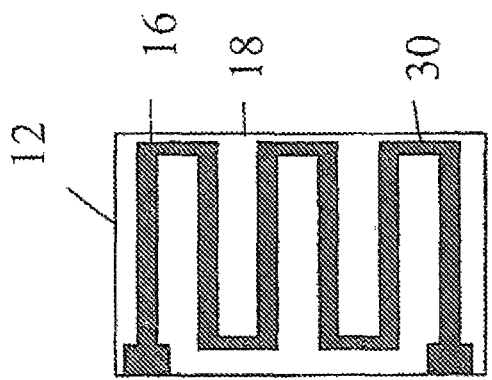
FIG. 2b is a top view of a top electrode for use with an electrode assembly having a mesh metal contact.
Figure 2A:
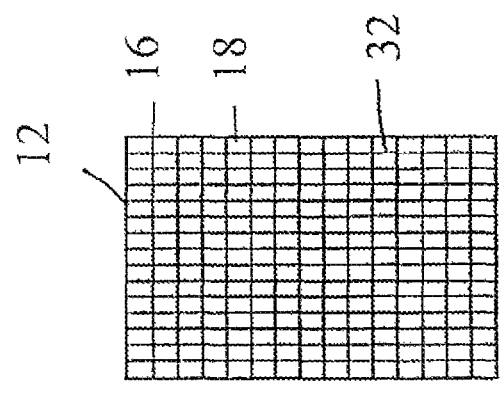
FIG. 2a is a top view of a top electrode for use with an electrode assembly having a serpentine metal contact.

With reference now to FIGS. 2a and 2b, different configurations of the top electrode 12 are shown. In FIG. 2a, the metal contact 16 comprises a serpentine metal contact 30. In FIG. 2b, the metal contact 16 comprises a metal mesh contact 32. Both types of electrodes 12 are only semi-transparent since the metal contact 16 partially blocks the UV-light from penetrating the top dielectric 18 to the underlying sample 24 (FIG. 1). However, this problem can be overcome either by rotating the underlying sample 24 during processing or rotating the top electrode 12 with the sample location 14 fixed. Such rotation ensures that the average UV-photon flux is uniform across the surface of the sample 24.

As shown in FIG. 3, the metal contact 16 is preferably encapsulated within UV-transparent glass 36. Encapsulation can be accomplished by using two thin glass plates 36 constructed from UV-transparent silica glass. The glass plates 36 will be joined together at a periphery using a vacuum-grade epoxy 38. Encapsulation prevents exposure of the top electrode 12 to hydrogen, which might lead to degradation of the metal contact and/or contamination of the process ambient by hydrogen-etching of the metal contact 16.

UV-activated insertion of hydrogen into semiconductors, i.e. hydrogenation, involves the irradiation of the sample 24 during exposure to hydrogen gas in a process ambient consisting of hydrogen gas (naturally occurring or an isotopically enriched gas, e.g. deuterium). Alternatively, the process ambient may include other gases such as nitrogen to dilute hydrogen below its flashpoint to reduce its flammability, to control surface reactions, or for other purposes. The prior art processes are limited in many applications by sample throughput. While process efficacy depends upon a number of factors, i.e. light wavelength, irradiance, and sample temperature, UV-activated hydrogenation normally suffers from a very low throughput. Typically, in-diffusion of hydrogen over several microns into a semiconductor requires from 3-24 hours of processing. Therefore, commercial viability of this technology depends critically upon methods of enhancing its throughput.

Since UV-irradiation is activated, in part, by changes in the surface potential due to emission of photoelectrons, a similar effect can be achieved by electrically biasing the surface with the top electrode 12. To produce the data in Table 2, demonstration of the effects of a DC bias was done using a wiremesh electrode 32 (FIG. 2b). Two different samples were evaluated-a Si(100) wafer that was B⁺-implanted (170 keV, $2\times10^{16}$ cm$^{-2}$) and annealed (@1100° C. for 15 min.); and a thin-film (3-μm) InSb film grown on GaAs(100) by molecular beam epitaxy. These samples were chosen since both contain a high-density of defects that trap sufficient amounts of hydrogen for detection. Table 1 provides the results at different bias voltages on the electrode 12. A low-pressure mercury (LP-Hg) lamp was used, which emits UV mainly at two wavelengths, 254 and 185 nm. It is clear that the use of sample biasing at −10V (which induces a positive charge on the surface) greatly increased the amount of in-diffused deuterium, while +10V bias inhibited in-diffusion. The observed enhancements in hydrogenation are significant and indicate the value of this technique. Even greater enhancements can be expected by optimization of the process, i.e. bias voltage, which is dependent on the material type and surface preparation.

TABLE 1

Comparison of the effectiveness of a standard UV (100° C., 24 hr.) deuteration process with and without sample biasing.

| Sample | Lamp | Temperature (° C.) | Time (hr.) | Standard (Deuterium/cm²) | Voltage (−10 V) | Voltage (−100 V) | Voltage (+10 or +100) |
|---|---|---|---|---|---|---|---|
| Si | LP-Hg | 100 | 24 | $4.9 \times 10^{14}$ | $1.9 \times 10^{15}$ (4.2) | $1.4 \times 10^{15}$ (2.9) | $2.2 \times 10^{14}$ (0.52) |
| InSb | LP-Hg | 100 | 24 | $5.4 \times 10^{14}$ | $3.5 \times 10^{15}$ (6.5) | $1.0 \times 10^{15}$ (1.9) | $1.5 \times 10^{14}$ (0.43) |

The values listed parenthetically in the voltage columns provide the ratio of the incorporate deuterium (an isotope of hydrogen, H²) relative to the standard process (without voltage). For instance, application of −10V to the field electrode enhanced deuterium incorporation in InSb by a factor of 6.5. The deuterium incorporation was determined using an ion-induced nuclear reaction analysis (NRA). The samples were irradiated with energetic He³ ions to react with deuterium as follows: H²(He³, p)He⁴. Standard analysis of the reaction products, alpha particles (He⁴) and protons (p) was done to determine the areal concentration (cm⁻²) of the in-diffused deuterium.

Alternatively, application of an electric field to the sample 24 may have benefits other than those related to the surface potential. Since the motion of hydrogen in semiconductors occurs mostly as ionized atomic hydrogen, the application of an intense electric field to the sample during UV irradiation results in field-assisted drift (FED) of hydrogen. Drift differs from diffusion of hydrogen in that it is not thermally activated and consists of directed motion (rather than random) along the field lines. However, the field must be sufficiently strong to ensure that the drift component of motion dominates. Thus, in-situ application of an electric field can be used to enhance and direct the motion of hydrogen into a semiconductor sample 24. Since the charge-state is affected by the position of the Fermi level, positive-charged hydrogen (H⁺) is often the preferred state due to its small size (compared to H⁻ or H⁰), a positive voltage on the electrode (negative biasing of the sample) should yield an electric field directed into the sample to cause positive ions to drift inwards. Interestingly, the sign of the voltage is opposite that used to alter the surface potential to enhance adsorption/dissociation of hydrogen. Therefore, an optimal biasing scheme should consist of an alternating bias voltage (AC voltage) that applies both a positive and negative voltage to the field electrode 12 during a cycle.

Figure 4:
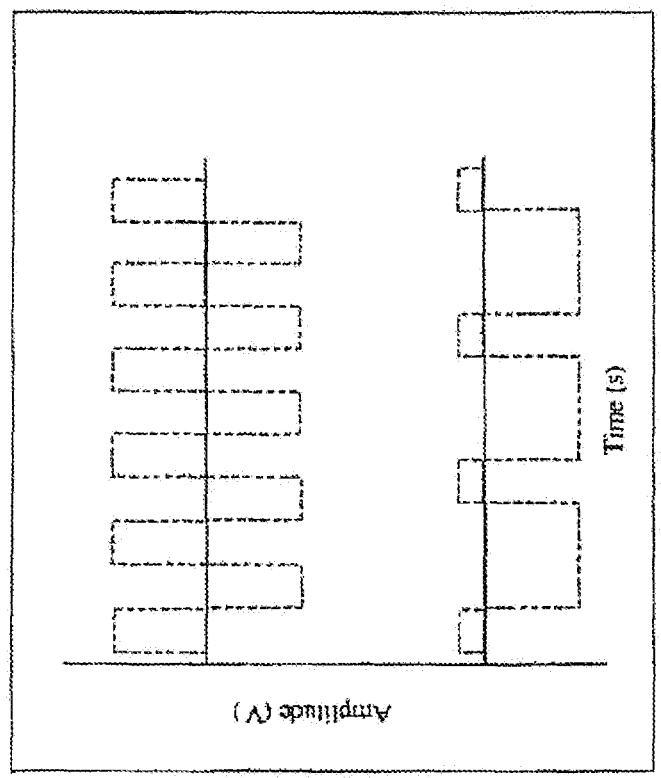
FIG. 4 is a graphical representation of applied AC voltage for use with the present invention.

However, determination of an optimal AC voltage is complicated by dielectric properties of the material, which causes substantial shielding of the field within the material. The penetration depth of the field is given by the Debye length, a characteristic length depending only upon fundamental material properties, i.e. dielectric constant and carrier density.) The Debye length (d) is given by $$d = \left(\frac{\varepsilon \cdot \varepsilon_0 \cdot kT}{e^2 \cdot c_0}\right)^{1/2}$$

where $\in$ and $\in_0$ are the electric permittivity of the material and free space, respectively; k is Boltzman's constant, e is value of a unit charge; and $c_0$ the density of carriers in the material. It is clear that the non-equilibrium carrier density formed by electron-hole generation during UV-irradiation must be considered. Both the complex nature of the electrical permittivity and the effects of the UV-irradiation determine the frequency response to an AC waveform, i.e. dispersion within the medium. As such, the optimal positive and negative portions of the voltage waveform may not be symmetric as shown at the top of FIG. 4, but rather could have different durations and amplitude as indicated at the bottom of FIG. 4.

Thus, since drift of hydrogen occurs without the need for thermal activation, FED does not require a large thermal budget (the integrated time-temperature product, t-T) to activate the motion of hydrogen. A low thermal budget eliminates or reduces process-induced problems such as interdiffusion within semiconductors (especially heterostructures), hydrogen-induced etching of the surface, re-deposition of impurities on the sample due to etching from other surfaces exposed to hydrogen, etc. Also, field-enhanced hydrogenation offers a more efficient process for hydrogenating materials, which is especially important when the material is very thick, i.e. bulk samples. The electrode described above for use in altering the surface potential (by application of a relatively small voltage) can also be used to apply an electric field to a sample (generally requiring much higher voltages).

The previous difficulty in applying electric fields during hydrogenation is substantially overcome by the combination of the UV-transparent electrode 12 as in FIG. 1 and the use of UV light source 28 to activate the hydrogenation. Furthermore, while post-hydrogenation application of an electric field may redistribute the in-diffused hydrogen, it does not result in enhanced incorporation of hydrogen within the sample 24, which is required especially for treating thick samples.

In this regard, there is evidence of complex behavior of hydrogen in semiconductors. In each case, devices slowly degrade during operation due to "defect de-passivation," which occurs as a result of Si—H bond breaking. However, the rate of degradation can be greatly reduced by as much as a factor of 50 by hydrogenation with deuterium (D), a stable isotope of hydrogen. This isotopic effect is due to enhanced stability of the Si-D bond that derives from substantial overlap of the Si-D bending vibration frequencies with those related to the Transverse-Optical (TO) mode of lattice vibration. This coupling substantially reduces the lifetime of the hot-electron excited Si-D state, and thus its probability of dissociation.

Another notable example related to the complex behavior of hydrogen involves GaN, a material whose intrinsic properties enables fabrication of high-mobility, electron transistors (HEMTs) that operate at high temperature and voltage. However, hot-electron induced degradation of AlGaN/GaN power HEMT's with SiN passivation can severely limit the lifetime of these devices. Typically, degradation characteristics consist of a decrease in the drain current and transconductance, similar to hot-electron effects in Si-based MOS transistors. Results of hot-electron stressing of devices indicate possible changes in trapped charge at the SiN/AlGaN interface and/or at sites within the bulk of the heterostructure. It is important to note that large amounts of hydrogen can be incorporated in the SiN passivation layer during deposition, which is done at ~300° C. by PECVD with $NH_3$ as a precursor gas. The diffusivity of hydrogen at this temperature is sufficiently high for hydrogen to migrate into the underlying HEMT heterostructure. Such unintentional passivation may partially account for the impressive performance of HEMT devices despite the defective nature of the GaN heterostructure. Therefore, subsequent de-passivation during hot-electron stressing is presently thought to account for the observed instabilities in device performance, i.e. degradation.

While deuteration may offer immunity against hot-electron effects in electronic devices, it is complicated in GaN-based HEMTs by the unintentional hydrogenation of the HEMT structure. Therefore, an effective isotopic exchange process to mitigate hot-electron effects is required that would first remove the hydrogen (consisting mostly of protium, $^1$H— the most abundant isotope of hydrogen) from the heterostructure and then replace it with deuterium. The isotopic exchange method detailed within this disclosure could be readily applied to suppress hot-electron effects in GaN HEMTs, as well as other devices such as a-Si photovoltaics. Isotopic replacement requires the extraction of protium followed by insertion of deuterium (D).

Hydrogen extraction, while less familiar than insertion, can be accomplished by use of UV irradiation of a semiconductor wafer 24 to dissociate bound hydrogen within the near surface (≤1 µm). The extraction process is done under high vacuum conditions to ensure that released hydrogen is permanently removed from the sample 24. This method can be enhanced by simultaneous application of an electric field by the top electrode 12 (FIG. 1) during UV-irradiation to direct the motion of hydrogen out of the sample. Field-assisted drift of hydrogen promotes extraction of mobile (non-bonded) hydrogen from the sample.

Different UV-lamp sources 28 can be used to match their spectral output ensures the dissociation of the targeted hydrogen-bond. For example, the output of the LP-Hg discharge tube consists of two dominant wavelengths, 184.9 and 253.7 nm. In the case of the GaN heterostructure, the 184.9 nm (6.67 eV) photon is strongly absorbed within SiN passivation layer (band gap 5 eV), while the lower energy 253.7 nm photons (4.88 eV) are not. Rather, the longer wavelength photon will penetrate the SiN layer and be absorbed within the underlying GaN substrate. Thus, the combined effect of irradiation with these two-dominant wavelengths ensures that hydrogen is dissociated within both the surface nitride, as well as the underlying GaN. After dissociation, the mobile hydrogen is removed from the sample 24 by field-assisted drift. Such tuning of the spectral distribution of the UV-radiation can be done using a different UV source 28 or filtering to tailor it to the sample 24 composition and structure.

Ultraviolet (UV) radiation may be used to activate reactive-gas etching of the surface of a semiconductor wafer sample 24. Such etching is activated by the interaction of energetic photons with the surface to break or excite chemical bonds. While atomic hydrogen is very reactive, hydrogen-induced etching can be enhanced by the photolytic activity of UV light. Furthermore, the wavelength of light may be selected to target the activation of specific chemical or physical processes, thus providing selectivity during etch. UV/etching is inherently a highly flexible process that can be modified by the judicious choice of UV-light source 28 or filters to yield a photon bandwidth that is application specific.

Figure 5:
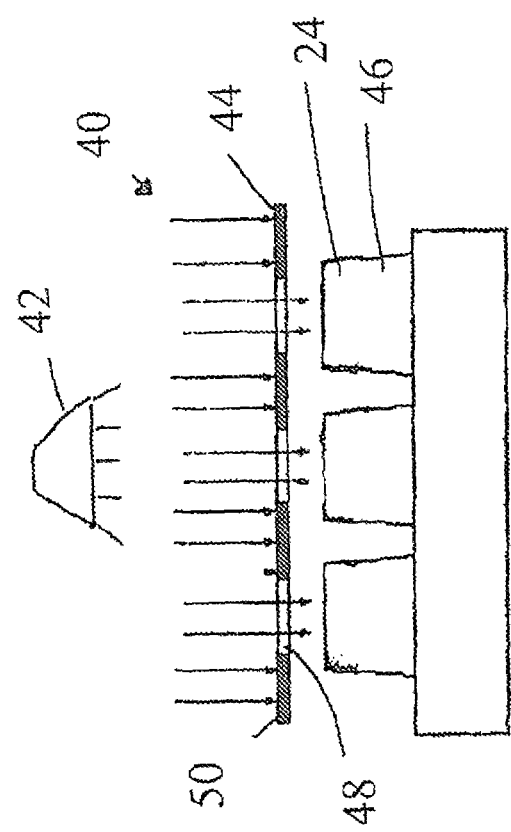
FIG. 5 is a side view of a UV mask for use in limiting the UV-activated processing to selected areas of the sample surface.

With reference now to FIG. 5, an etching apparatus 40 is shown therein. The apparatus comprises a UV light source 42, a mask 44, and a sample location 46. The sample 24 is located at the sample location 46. As shown, the sample 24 is a mesa-type photodiode. The mask 44 comprises UV-transparent sections 48 and UV-opaque sections 50.

The preferred method is implemented using UV light in the range of 100-400 nm to irradiate a wafer in the presence of hydrogen gas. The hydrogen ambient may include any of the isotopes of hydrogen, e.g. protium, deuterium, or tritium, and is not limited to a particular range of pressure, although low-pressure processing preferentially enhances the rate of hydrogen etching over hydrogenation, i.e. in-diffusion of hydrogen. Two distinct applications for UV/etching are envisioned: removal of surface impurities for wafer 24 cleaning and engraving of patterns within semiconductor wafers 24 and thin films, e.g. as required for device fabrication. The UV/etching method is a simple-to-use, dry process which is inexpensive to set up and operate. The flexibility and ease of implementation should enable it to be readily employed throughout semiconductor processing and microelectronics manufacturing, which involves a number of cleaning and patterning processes.

Cleaning of wafers 24 may take place either using UV/hydrogen etching alone or in conjunction with UV/ozone processing. The choice of cleaning method is dictated by the impurities targeted for removal from the wafer 24 surface. In particular, the use of UV/ozone cleaning selectively removes hydrocarbons, organic molecules, and other easily volatilized complexes from the surface. Alternatively, UV/hydrogen etching can remove reacted layers like oxides and nitrides that form during air exposure or as a result of intentional processing. For example, hydrogen-induced cleaning is often used prior to molecular beam epitaxy (MBE) to clean substrate wafers and ensure high-quality growth of epilayers. It is well established that exposure of atomic hydrogen to many III-V, II-VI, and elemental semiconductors, typically at elevated temperatures, produces a semiconductor surface that is entirely free of contamination. The combination of these UV-activated etching techniques will yield a highly effective method for removing a variety of surface impurities and contaminants. Surface particulates should, however, be removed prior to UV/cleaning using either mechanical or wet processing methods, i.e. rinsing, scrubbing or ultrasonic cleaning.

The use of UV-radiation in wafer processing offers a number of unique advantages that mostly derive from the unique properties of light. In particular, the directionality of light enables the use of a masking technique to yield selective-area wafer 24 processing. A selective-area process is one that limits or confines the processing of wafers 24 to designated areas without affecting contiguous regions. Thus, selective-area UV/etching can be used for pattern transfer/engraving of the surface of a semiconductor wafer 24, as required for manufacturing of integrated circuits. Moreover, while selective-area, UV processing can be implemented using standard masking and photolithographic techniques, it can also be done using a simple shadow-mask technique.

Selective-area processing of wafers with UV light can also be implemented using a simple mask 44 technique to selectively clean the surface of a semiconductor wafer 24. For example, selective-area cleaning could be used to avoid regions on processed wafers 24 that might be degraded by UV/cleaning, e.g. metal runs on a chip, passivation layers, etc.

Since photochemical processes depend upon light absorption, the wavelength emitted by the UV source 28 is an important variable. The choice of a UV source 28 is therefore dictated by matching its spectral output with the targeted UV/etching process. For example the low-pressure mercury (LP-Hg) discharge tube generates two wavelengths of interest, 184.9 and 253.7 nm. The lower wavelength (184.9 nm) is absorbed by oxygen, and thus leads to the generation of ozone, whereas the higher wavelength (253.7 nm) does not. However the higher wavelength is absorbed by most hydrocarbons and ozone. Therefore, when both wavelengths are present, ozone is continually being formed and destroyed. Ozone from a separate source is often used to achieve higher rates of cleaning.

It is important to note that UV-activated etching/cleaning can easily be used in conjunction with hydrogenation of wafers 24 for defect passivation since they both can be performed using the same etching assembly 40. These processes are distinguishable by their purpose or objective, as well as their respective processing parameters. Hydrogenation for defect passivation can be critical in device fabrication in wafers 24 containing a high-density of defects to ensure that devices function optimally. Since the rate of in-diffusion of hydrogen into a semiconductor wafer 24 is greatly affected by the surface composition and morphology, it is very important that hydrogenation be performed after appropriate surface preparation, which normally involves cleaning. Thus, the use of UV-activated processing within the etching assembly 40 for both cleaning and hydrogenation yields an extremely versatile tool for semiconductor processing.

The main process parameter that determines relative rates of cleaning verses hydrogenation is ambient pressure. Hydrogenation is normally performed at or above atmospheric pressure in pure hydrogen or a hydrogen/nitrogen gas mixture. In general, in-diffusion of hydrogen depends directly upon the partial pressure of hydrogen within the process ambient. This is simply due to the higher concentration of hydrogen at the surface that can be absorbed and in-diffused within the bulk of the semiconductor wafer sample 24. Conversely, high-pressure inhibits sublimation and/or surface etching.

The pressure of the process ambient provides a means of controlling hydrogen-related processes, i.e. high pressure enhances the rate of hydrogenation for a given thermal budget, while low pressure favors sublimation/etching. For instance, processing at a pressure of ~$10^{-4}$ Torr will result in a substantial increase in the etching rate while substantially limiting the amount of hydrogen in-diffusion.

The unique properties of light allow for a much simpler process of masking and patterning. Shadow masking for selective-area hydrogen etching as shown in FIG. 5, which illustrates the positioning of the shadow mask 44 over an array of mesa-type photodiodes 24. It is designed so that alignment can be performed under a microscope (not shown), after which the etching assembly 40 is transferred into the treatment chamber with the alignment preserved. Alignment marks on the mask 44 are used to orient the photodiode array 24 on the chip. After crude alignment is achieved, the mask 44 is secured in place. Once the mask 44 is secured in place, more precise alignment is then achieved by directly viewing the metallized tops of the mesas 24 through the mask array. After alignment, the entire apparatus 40 is transferred to a reaction chamber for UV treatment.

UV/ozone surface cleaning has been reported by a number of investigators to be an effective method of removing a variety of contaminants from surfaces, primarily including hydrocarbons and other easily volatilized molecules. It can rapidly produce clean semiconductor surfaces over a range of processing pressure (from atmospheric to vacuum). By proper placement of a pre-cleaned surface within a few millimeters of an ozone producing UV source, a clean surface can rapidly be achieved. This technique is capable of producing near-atomically clean surfaces.

A number of cleaning procedures have been used to remove easily-oxidized contaminants, like hydrocarbons, including boiling in hydrogen peroxide ($H_2O_2$), treatment in hot oxidizing solutions such as nitric acid or potassium dichromate, exposure to an oxygen plasma, and high temperature air firing. However, UV/ozone cleaning has many advantages, especially for the cleaning of semiconductor surfaces. In particular, it is inherently a clean process that can be performed at atmospheric pressure and does not involve the generation of ions that lead to electrostatic charging of the wafer. Furthermore, the rate of UV/ozone cleaning can be increased by supplying additional ozone from a separate source or by mild heating.

Combined with UV-activation, the methods described herein provide a means of selective-area processing of the surface of a sample, which can be utilized for selective area etching as required for wafer patterning. UV light is used to activate a number of chemical processes that can be used for etching of semiconductor wafers 24. Such etching is used both for surface cleaning, as well as etching of patterns into the wafer 24 as required in device fabrication, e.g. microelectronics. The UV/hydrogen etching process can be utilized over a large dynamic range in pressure and temperature to provide an extremely flexible processing tool.

While UV/hydrogen etching of semiconductor wafers can be used in applications in semiconductor technology where $F^-$ or $Cl^-$ etchants should be avoided, this invention is not limited to UV/hydrogen etching for wafer cleaning and pattern etching. Alternatively it could be used with any gas that yields free radicals such as $F^-$ or $Cl^-$ under UV radiation. While the use of hydrogen is the preferred mode of etching, the use of other gases in not precluded in this method.

One skilled in the art will understand that while semiconductors and insulators rather than metals are anticipated for use as the sample in this invention, other materials can be used in conjunction with this invention. For example, potential samples could include a wide range of materials differing in composition; i.e. elemental vs. compound semiconductors, etc. and morphology; i.e. crystalline or amorphous, bulk or thin film, etc.

What is claimed is:
1. A method for cleaning a sample comprising:
Placing the sample at a sample location;
Placing the sample location proximate a UV source and a source of cleaning gas at a pressure at or below atmospheric pressure;

Providing UV light and the cleaning gas to the sample; and hydrogenating the sample after cleaning, the step of hydrogenating the sample comprising the steps of:

providing a top electrode comprising a UV-transparent material and a metal contact such that a gap exists between the top electrode and the sample location;

providing process gas to the sample at the gap; and providing an electric field to the metal contact.

2. The method of claim 1 wherein the metal contact is serpentine.

3. The method of claim 2 wherein the distance between a first and a second portion of the serpentine metal contact is less than a width of the gap.

4. The method of claim 1 wherein the metal contact is mesh comprising a mesh size.

5. The method of claim 4 wherein the mesh size is less than a width of the gap.

6. The method of claim 1 comprising rotating the top electrode to evenly irradiate the sample with UV light by the source.

7. The method of claim 1 further comprising filling the gap with process gas.

8. The method of claim 7 wherein the process gas comprises hydrogen.

9. The method of claim 7 wherein the process gas comprises deuterium.

10. The method of claim 7 wherein the process gas is introduced into the gap at above atmospheric pressure.

11. The method of claim 10 comprising placing the metal contact between silica glass and sealing the metal contact with vacuum-grade epoxy.

12. The method of claim 1 further comprising encapsulating the metal contact within the UV-transparent material.

13. The method of claim 12 further comprising the step of pre-cleaning the sample prior to hydrogenation.

14. The method of claim 13 wherein the wafer is pre-cleaned by placing the sample proximate a UV source and source of a cleaning gas at a pressure at or below atmospheric pressure.

15. The method of claim 14 wherein the cleaning gas is ozone.

16. The method of claim 1 wherein the cleaning gas is hydrogen.

17. The method of claim 1 wherein the cleaning gas is a combination of ozone and hydrogen.

18. The method of claim 1 comprising charging the metal contact to alter a rate of hydrogenation.

19. The method of claim 1 wherein the sample location further comprises a dielectric.

20. The method of claim 1 comprising rotating the sample location relative to the top electrode such that the sample is evenly irradiated with UV light by the source.

21. The method of claim 1 wherein the electric field is an alternating electric field.

22. The method of claim 1 wherein the electric field is a static electric field.

23. The method of claim 1 further comprising the step of processing the sample in a hydrogen-rich ambient at a pressure below atmospheric pressure.

24. The method of claim 1 wherein the electric field enhances the rate of hydrogenation.

25. The method of claim 1 wherein the electric field retards the rate of hydrogenation.

26. The method of claim 1 wherein the sample is a semiconductor wafer.

27. The method of claim 1 further comprising etching the sample using a UV-opaque mask to shield a portion of the sample from UV light.

28. The method of claim 27 further comprising using the electrode to provide a voltage to the sample during etching.

29. The method of claim 1 wherein the cleaning gas comprises deuterium.

30. The method of claim 1 wherein the sample location is placed proximate a UV source and a source of cleaning gas at a pressure of 0.00001 to 0.2 Torr.

* * * * *